United States Patent
Ho et al.

(10) Patent No.: US 10,964,800 B2
(45) Date of Patent: Mar. 30, 2021

(54) SEMICONDUCTOR DEVICE HAVING FIN-END STRESS-INDUCING FEATURES

(71) Applicant: Intel Corporation, Santa Clara, CA (US)

(72) Inventors: Byron Ho, Hillsboro, OR (US); Michael L. Hattendorf, Portland, OR (US); Jeanne L. Luce, Hillsboro, OR (US); Ebony L. Mays, Hillsboro, OR (US); Erica J. Thompson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/342,865

(22) PCT Filed: Dec. 2, 2016

(86) PCT No.: PCT/US2016/064658
§ 371 (c)(1),
(2) Date: Apr. 17, 2019

(87) PCT Pub. No.: WO2018/101957
PCT Pub. Date: Jun. 7, 2018

(65) Prior Publication Data
US 2020/0058761 A1    Feb. 20, 2020

(51) Int. Cl.
*H01L 29/78* (2006.01)
*H01L 29/06* (2006.01)
(Continued)

(52) U.S. Cl.
CPC .... *H01L 29/6681* (2013.01); *H01L 21/76224* (2013.01); *H01L 21/76897* (2013.01);
(Continued)

(58) Field of Classification Search
CPC ................................................ H01L 29/7846
See application file for complete search history.

(56) References Cited

U.S. PATENT DOCUMENTS

| 9,608,065 B1* | 3/2017 | Bergendahl ....... H01L 29/66545 |
| 2007/0034925 A1* | 2/2007 | Lee .................... H01L 29/7851 257/296 |

(Continued)

OTHER PUBLICATIONS

International Search Report and Written Opinion for International Patent Application No. PCT/US2016/064658 dated, Aug. 28, 2017, 10 pgs.

(Continued)

*Primary Examiner* — Omar F Mojaddedi
(74) *Attorney, Agent, or Firm* — Schwabe, Williamson & Wyatt, P.C.

(57) ABSTRACT

Semiconductor devices having fin-end stress-inducing features, and methods of fabricating semiconductor devices having fin-end stress-inducing features, are described. In an example, a semiconductor structure includes a semiconductor fin protruding through a trench isolation region above a substrate. The semiconductor fin has a top surface, a first end, a second end, and a pair of sidewalls between the first end and the second end. A gate electrode is over a region of the top surface and laterally adjacent to a region of the pair of sidewalls of the semiconductor fin. The gate electrode is between the first end and the second end of the semiconductor fin. A first dielectric plug is at the first end of the semiconductor fin. A second dielectric plug is at the second end of the semiconductor fin.

12 Claims, 11 Drawing Sheets

(51) Int. Cl.

| | |
|---|---|
| *H01L 29/66* | (2006.01) |
| *H01L 27/092* | (2006.01) |
| *H01L 27/088* | (2006.01) |
| *H01L 29/08* | (2006.01) |
| *H01L 21/762* | (2006.01) |
| *H01L 21/768* | (2006.01) |
| *H01L 21/8234* | (2006.01) |

(52) U.S. Cl.
CPC .. *H01L 21/823431* (2013.01); *H01L 27/0924* (2013.01); *H01L 29/0847* (2013.01); *H01L 29/66545* (2013.01); *H01L 29/7846* (2013.01); *H01L 29/7855* (2013.01)

(56) References Cited

U.S. PATENT DOCUMENTS

| | | | |
|---|---|---|---|
| 2010/0022061 A1 | 1/2010 | Wu et al. | |
| 2012/0273840 A1 | 11/2012 | Luo et al. | |
| 2013/0065371 A1* | 3/2013 | Wei | H01L 29/7848 438/294 |
| 2013/0248952 A1 | 9/2013 | Rosenbaum et al. | |
| 2015/0179644 A1* | 6/2015 | Akarvardar | H01L 29/0653 257/401 |
| 2015/0243544 A1 | 8/2015 | Alptekin et al. | |
| 2015/0325575 A1* | 11/2015 | Park | H01L 29/0653 257/401 |

OTHER PUBLICATIONS

Office Action from Brazilian Patent Application No. 112019008514-9, dated May 28, 2020, 6 pgs.

\* cited by examiner

SEMICONDUCTOR DEVICE HAVING FIN-END STRESS-INDUCING FEATURES

CROSS-REFERENCE TO RELATED APPLICATION

This patent application is a U.S. National Phase Application under 35 U.S.C. § 371 of International Application No. PCT/US2016/064658, filed Dec. 2, 2016, entitled "SEMICONDUCTOR DEVICE HAVING FIN-END STRESS-INDUCING FEATURES," which designates the United States of America, the entire disclosure of which is hereby incorporated by reference in its entirety and for all purposes.

TECHNICAL FIELD

Embodiments of the invention are in the field of semiconductor devices and processing and, in particular, semiconductor devices having fin-end stress-inducing features and methods of fabricating semiconductor devices having fin-end stress-inducing features.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced, maintaining mobility improvement and short channel control as device dimensions scale below the 10 nanometer (10 nm) node provides a challenge in device fabrication.

Many different techniques have been attempted to improve the mobility of transistors. However, significant improvements are still needed in the area of electron and/or hole mobility improvement for semiconductor devices.

DESCRIPTION OF THE EMBODIMENTS

Figure 2:
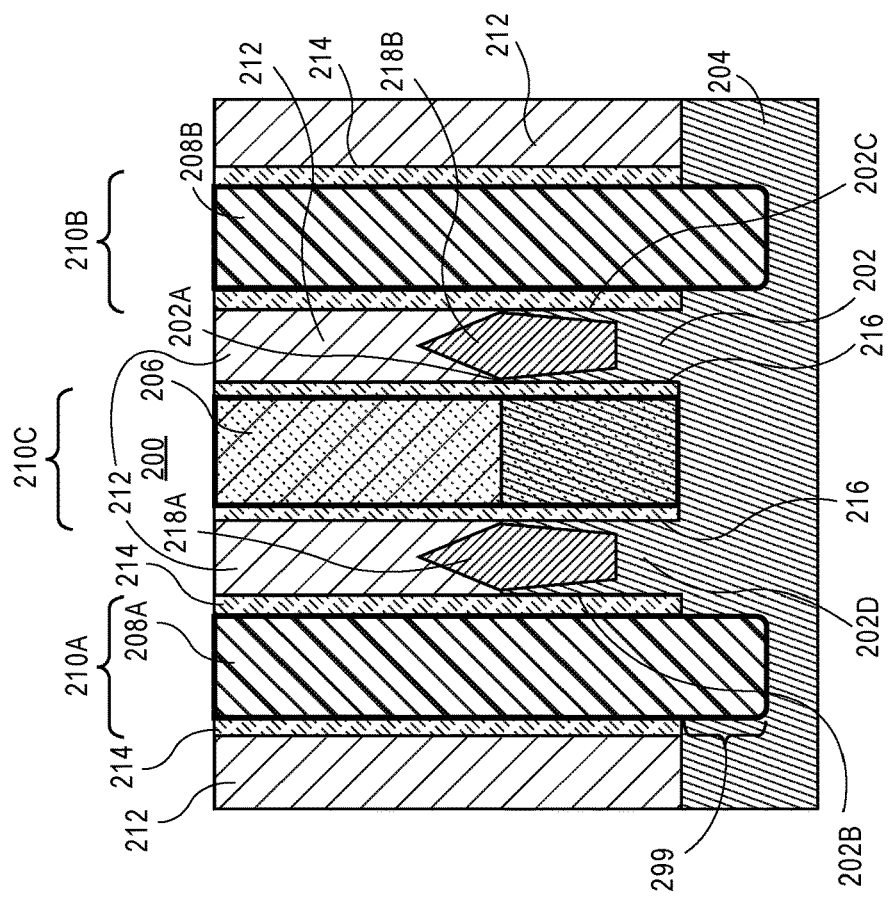
FIG. 2 illustrates a cross-sectional view of a semiconductor structure having fin-end stress-inducing features, in accordance with an embodiment of the present invention.

Semiconductor devices having fin-end stress-inducing features, and methods of fabricating semiconductor devices having fin-end stress-inducing features, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments are directed to the fabrication of fin-based semiconductor devices. Performance improvement for such devices may be made via channel stress induced from a poly plug fill process. Embodiments may include the exploitation of material properties in a poly plug fill process to induce mechanical stress in a metal oxide semiconductor field effect transistor (MOSFET) channel. As a result, an induced stress can boost the mobility and drive current of the transistor. In addition, a method of plug fill described herein may allow for the elimination of any seam or void formation during deposition.

To provide context, manipulating unique material properties of a plug fill that abuts fins can induce stress within the channel. In accordance with one or more embodiments, by tuning the composition, deposition, and post-treatment conditions of the plug fill material, stress in the channel is modulated to benefit both NMOS and PMOS transistors. In addition, such plugs can reside deeper in the fin substrate compared to other common stressor techniques, such as epitaxial source/drains. The nature of the plug fill to achieve such effect also eliminates seams or voids during deposition and mitigates certain defect modes during the process.

To provide further context, presently there is no intentional stress engineering for poly plugs. The stress enhancement from traditional stressors such as epitaxial source/drains, dummy poly gate removal, stress liners, etc. unfortunately tends to diminish as device pitches shrink. Addressing one or more of the above issues, in accordance with one or more embodiments of the present invention, an additional source of stress is incorporated into the transistor structure. Another additional benefit with such a process may be the elimination of seams or voids within the plug that are common with more conventional chemical vapor deposition methods.

Figure 1:
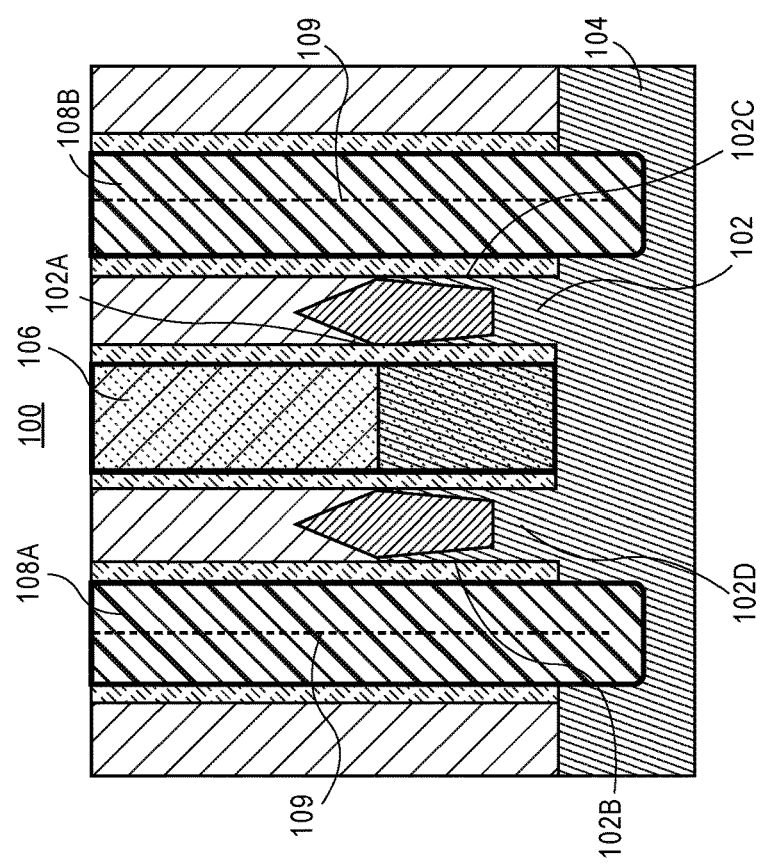
FIG. 1 illustrates a cross-sectional view of a state-of-the-art semiconductor structure having fin-end features with seams or voids.

As a comparison of a structure having plug fill features with stress-degrading seams or voids versus a structure having plug fill features without stress-degrading seams or voids, FIG. 1 illustrates a cross-sectional view of a state-of-the-art semiconductor structure having fin-end features with seams or voids, while FIG. 2 illustrates a cross-sectional view of a semiconductor structure having fin-end stress-inducing features, in accordance with an embodiment of the present invention.

Referring to FIG. 1, a semiconductor structure 100 includes a semiconductor fin 102 above a substrate 104. The semiconductor fin 102 has a top surface 102A, a first end 102B, a second end 102C, and a pair of sidewalls (one shown as 102D) between the first end 102B and the second end 102C. A gate electrode 106 is over a region of the top surface 102A and laterally adjacent to a region of the pair of sidewalls 102D of the semiconductor fin 102. The gate electrode 106 is between the first end 102B and the second end 102C of the semiconductor fin 102. A first dielectric plug 108A is at the first end 102B of the semiconductor fin 102. A second dielectric plug 108B is at the second end 102C of the semiconductor fin 102. The first and second dielectric plugs 108A and 108B may each include a seam 109.

By contrast, referring to FIG. 2, a semiconductor structure 200 includes a semiconductor fin 202 above a substrate 204. The semiconductor fin 202 has a top surface 202A, a first end 202B, a second end 202C, and a pair of sidewalls (one shown as 202D) between the first end 202B and the second end 202C. A gate electrode 206 is over a region of the top surface 202A and laterally adjacent to a region of the pair of sidewalls 202D of the semiconductor fin 202. The gate electrode 206 is between the first end 202B and the second end 202C of the semiconductor fin 202. A first dielectric plug 208A is at the first end 202B of the semiconductor fin 202. A second dielectric plug 208B is at the second end 202C of the semiconductor fin 202.

Figure 3B:
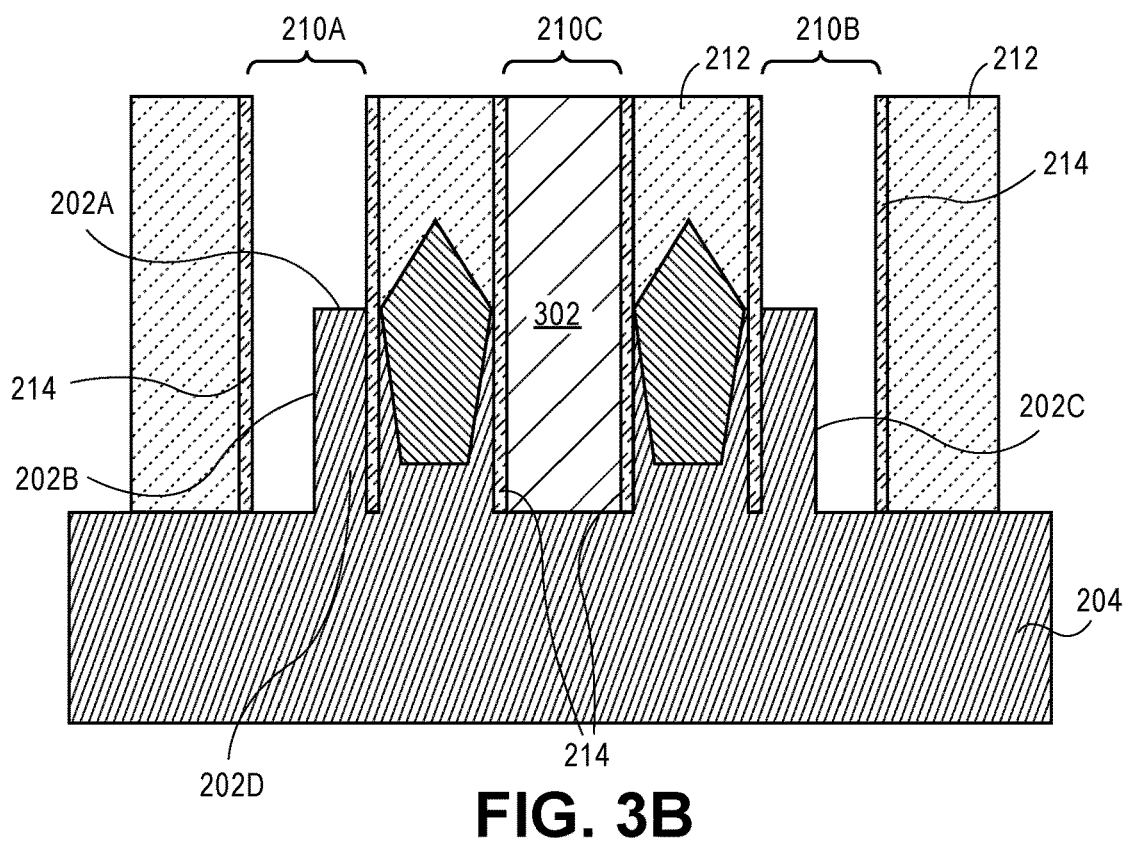
Figure 4A:
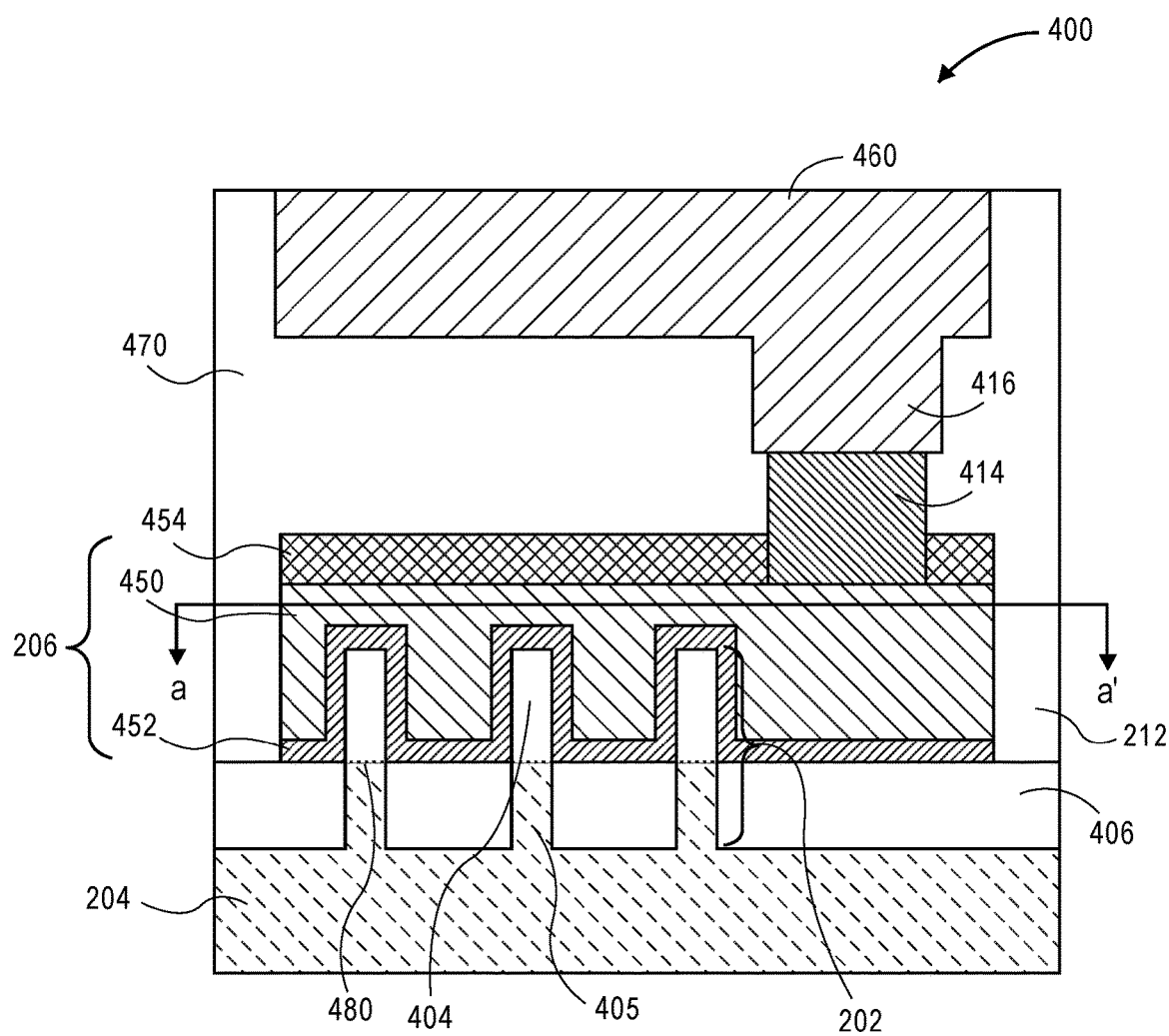
FIGS. 4A and 4B illustrate a cross-sectional view and a plan view (taken along the a-a' axis of the cross-sectional view), respectively, of a non-planar semiconductor device having fin-end stress-inducing features, in accordance with an embodiment of the present invention.

It is to be appreciated that the view shown in FIG. 2 is slightly in front of the fin 202, in order to show the gate electrode 206 on sidewalls 202D of the fin 202. It is also to be appreciated that the fin 202 may protrude through a trench isolation region above the substrate 204. Although such a trench isolation region is not viewed from the perspective of FIG. 2, and exemplary trench isolation region is depicted in FIG. 4A, described below. Also, as would look the same in the view of FIG. 2, but as is seen in FIG. 3B, in one embodiment, the first dielectric plug 208A is formed over a portion of the first end 202B of the semiconductor fin 202, and the second dielectric plug 208B is formed over a portion of the second end 202C of the semiconductor fin 202. However, in another embodiment, the first dielectric plug 208A is formed at but not over the first end 202B of the semiconductor fin 202, and the second dielectric plug 208B is formed at but not over the second end 202C of the semiconductor fin 202. Additionally, it is to be appreciated that more than one gate electrode 206 may be included between the first dielectric plug 208A and the second dielectric plug 208B along the semiconductor fin 202.

Referring again to FIG. 2, the first dielectric plug 208A and the second dielectric plug 208B do not include a void or a seam. Such an arrangement can be described as having void-free first dielectric plug 208A and second dielectric plug 208B, or a first dielectric plug 208A and second dielectric plug 208B that are free of voids.

As is also depicted in FIG. 2, in an embodiment, one or both of the first dielectric plug 208A and the second dielectric plug 208B is deeper into the substrate 204 than the semiconductor fin 202, e.g., by an amount 299. Such an arrangement may be achieved in a replacement dummy gate process in which gate trenches are extended post dummy gate removal and prior to gate trench fill, also referred to as poly plug fill.

In an embodiment, the first and second dielectric plugs 208A and 208B are each disposed in a corresponding trench 210A and 210B, respectively, disposed in an inter-layer dielectric layer 212, as is depicted in FIG. 2. In one such embodiment, the trenches 210A and 210B each include a dielectric sidewall spacer 214. Similarly, in an embodiment, a trench 210C in which the gate electrode 206 is disposed includes dielectric sidewall spacers 216, as is depicted in FIG. 2.

In an embodiment, as described below in greater detail in association with FIGS. 3A-3F, and with reference to FIG. 3F, the first and second dielectric plugs 208A and 208B each include a first dielectric material 304 laterally surrounding and below a second dielectric material 308 different from the first dielectric material 304. In one such embodiment, the first dielectric material 304 is silicon nitride, and the second semiconductor material 308 is silicon oxide. In a specific such embodiment, the first dielectric material is further over the second dielectric material 308, e.g., as an additional portion 310. In another specific embodiment, however, the first and second dielectric plugs 208A and 208B each further include a third dielectric material over the second dielectric material 308 and between portions of the first semiconductor material 304, the third dielectric material different from the first and second dielectric materials, e.g., as a case where 310 is a different dielectric material.

Referring again to FIG. 2, semiconductor structure 200 further includes a first source/drain region 218A between the gate electrode 206 and the first dielectric plug 208A at the first end 202B of the semiconductor fin 202. A second source/drain region 218B is between the gate electrode 206 and the second dielectric plug 208B at the second end 202C of the semiconductor fin 202. In an embodiment, the first and second source/drain regions 218A and 218B are embedded source/drain regions. The first and second source/drain regions 218A and 218B are said to be "embedded epi" source and drain regions because they are formed by first removing portions of the fin 202 and then epitaxially growing the first and second source/drain regions 218A and 218B. The use of embedded epi first and second source/drain regions 218A and 218B may improve device performance by inducing stress. In one embodiment, the source/drain regions 218A and 218B are embedded source/drain regions composed of a semiconductor material different than the semiconductor material of the semiconductor fin 202.

In an embodiment, the region of the top surface 202A and the region of the pair of sidewalls 202D of the semiconductor fin 202 associated with gate electrode 206 define a channel region of an N-type semiconductor device. In one such embodiment, the first dielectric plug 208A and the second dielectric plug 208B induce a uniaxial tensile stress on the channel region. In another embodiment, the region of the top surface 202A and the region of the pair of sidewalls 202D of the semiconductor fin 202 associated with gate electrode 206 define a channel region of a P-type semiconductor device. In one such embodiment, the first dielectric plug 208A and the second dielectric plug 208B induce a uniaxial compressive stress on the channel region.

In an exemplary processing scheme, FIG. 3A-3F illustrate cross-sectional views representing various operations in a method of fabricating a semiconductor structure having fin-end stress-inducing features, in accordance with an embodiment of the present invention.

Figure 3A:
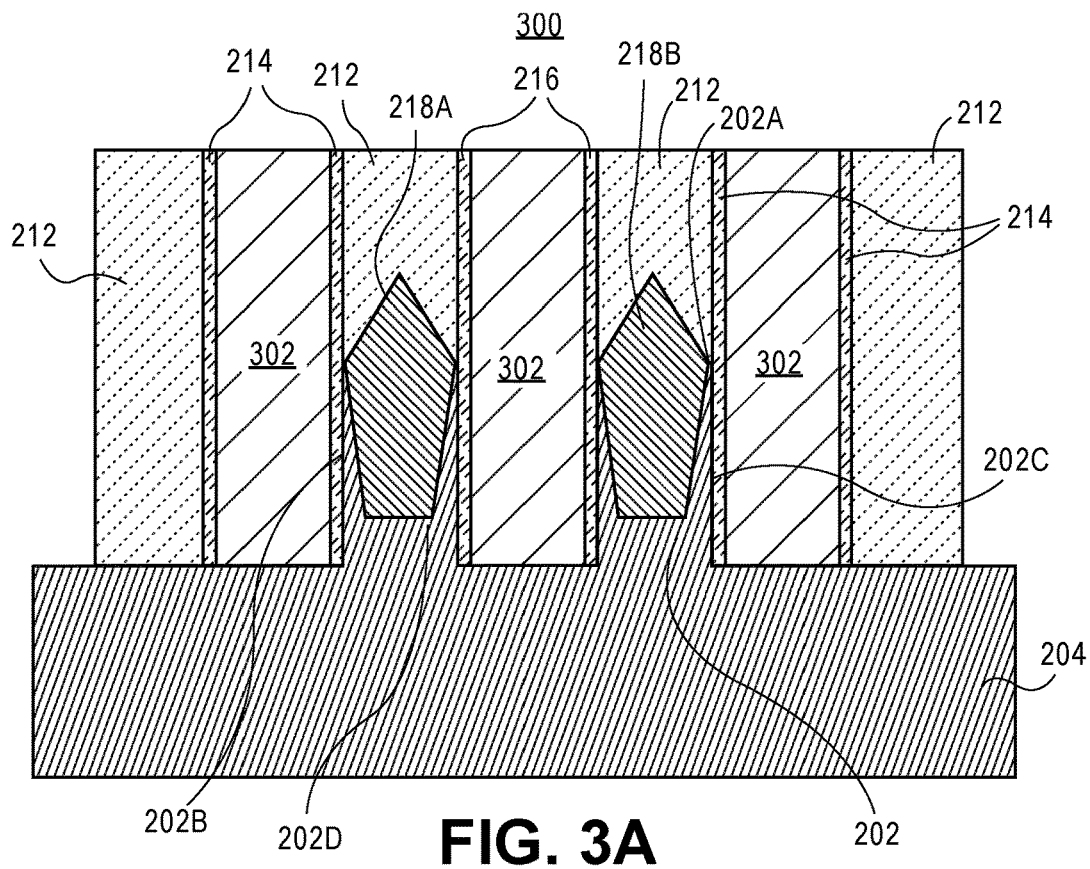
FIG. 3A-3F illustrate cross-sectional views representing various operations in a method of fabricating a semiconductor structure having fin-end stress-inducing features, in accordance with an embodiment of the present invention.

Referring to FIG. 3A, a method of fabricating a semiconductor structure begins with forming a starting structure 300. A semiconductor fin 202 is formed as protruding through a trench isolation region above a substrate 204 (trench isolation region depicted in FIG. 4A). The semiconductor fin 202 has a top surface 202A, a first end 202B, a second end 202C, and a pair of sidewalls 202D between the first end 202B and the second end 202C. A plurality of dummy gate structures 302 is formed above the semiconductor fin 202 and separated from one another by an inter-layer dielectric (ILD) layer 212. A first of the plurality of dummy gate structures 302 (left-hand 302) is at the first end 202B of the semiconductor fin 202. A second of the plurality of dummy gate structures 302 (middle 302) is over a region of the top surface 202A and laterally adjacent to a region of the pair of sidewalls 202D of the semiconductor fin 202. A third of the plurality of dummy gate structures 302 (right-hand 302) is at the second end 202C of the semiconductor fin 202.

In an embodiment, forming starting structure 300 further included forming embedded source and drain regions 218A and 218B, as is depicted. In an embodiment, each of the plurality of dummy gate structures 302 has associated dielectric sidewalls spacers 214 or 216, as is also depicted. It is to be appreciated that the dielectric sidewalls spacers 214 or 216 may be essentially the same at this stage but will ultimately be a sidewall spacer for a dielectric plug (sidewall spacer 214) or a gate electrode (sidewalls 216). Also, it is to be appreciated that more than one dummy gate structures 302 may be included between the two end dummy gate structures 302.

In an embodiment, the dummy gate structures 302 each form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines 302 spaced at a constant pitch and having a constant width. The pattern may be fabricated by a pitch halving or pitch quartering, or other pitch division, approach. It is to be appreciated that the view shown in FIG. 3A is slightly in front of the fin 202, in order to show the dummy gate structures in front of the fin 202.

Referring to FIG. 3B, the dummy gate structures 302 at the ends (e.g., the first and third structures) of the fin 202 are removed, while the dummy gate structure(s) 302 between the dummy gate structures 302 at the ends of the fin 202 are retained (e.g., the middle 302 is retained). In an embodiment, removing the dummy gate structures 302 at the ends of the fin 202 leaves trenches 210A and 210B, respectively, with dielectric sidewalls spacers 214. In a particular embodiment, removing the dummy gate structures 302 at the ends of the fin 202 exposes end portions 202B and 202C and top surface 202A portions of the semiconductor fin 202, as is depicted in FIG. 3B. This arrangement is formed by having outermost dummy gate structures formed over a portion of the ends and top surface of the semiconductor fin, and ultimately provides dielectric plugs over a portion of the ends and top surface of the semiconductor fin. In another embodiment (not depicted), removing the dummy gate structures 302 at the ends of the fin 202 exposes only the end portions 202B and 202C and not top surface 202A portions of the semiconductor fin 202. This arrangement is formed by having outermost dummy gate structures formed only at the ends of the semiconductor fin, and ultimately provides dielectric plugs only at the ends of the semiconductor fin.

Referring to FIGS. 3C-3F, in an embodiment, a first dielectric plug (such as dielectric plug 208A of FIG. 2) is formed in the first trench 210A. A second dielectric plug (such as dielectric plug 208B of FIG. 2) is formed in the second trench 210B. A particular exemplary dielectric plug structure and its formation are illustrated in association with FIGS. 3C-3F. It is to be appreciated that the view shown in FIGS. 3C-3F is slightly in front of the fin 202, in order to show the dielectric liner 304 in front of the fin 202.

Figure 3C:
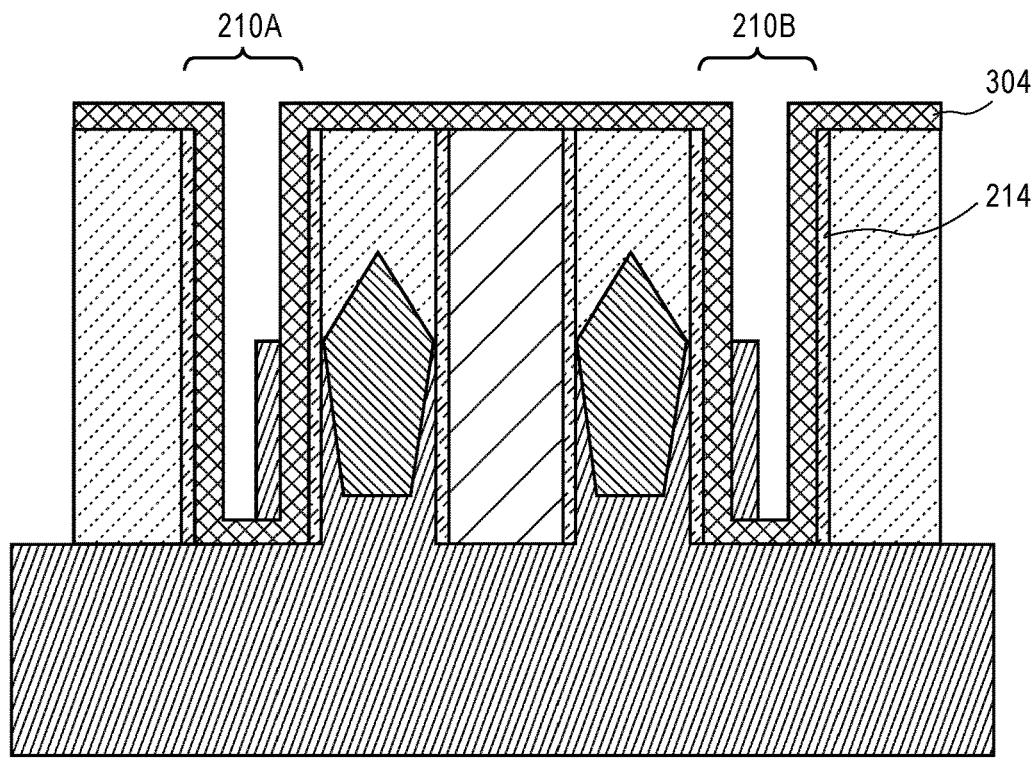

Referring to FIG. 3C, a dielectric liner 304 is formed conformal with the structure of FIG. 3B. In an embodiment, the dielectric liner 304 is formed along the sidewalls of trenches 210A and 210B without pinching off, or forming a seam, or forming a closed-off void, any of which may otherwise lead to a reduction in stress transfer from a dielectric plug ultimately formed there from. In a specific embodiment, the dielectric liner 304 is a silicon nitride film, e.g., formed using chemical vapor deposition (CVD). Thus, in an embodiment, dielectric plug formation begins with forming a first dielectric material 304 along sidewalls and bottoms of the first and second trenches 210A and 210B.

Figure 3D:
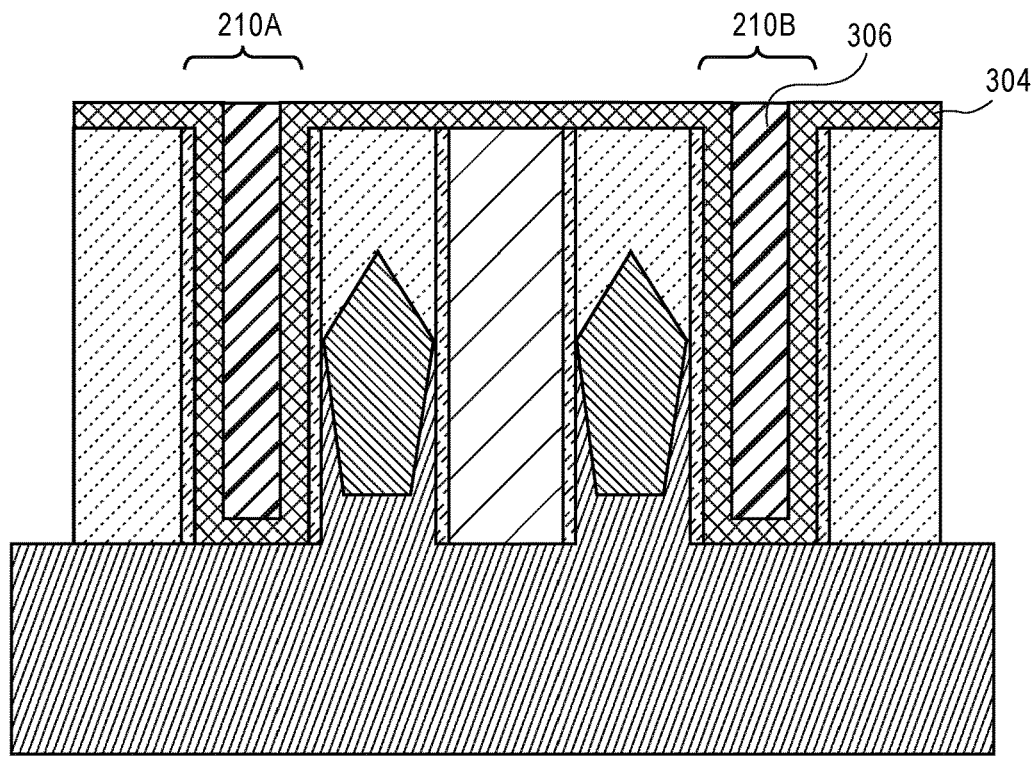
Figure 3E:
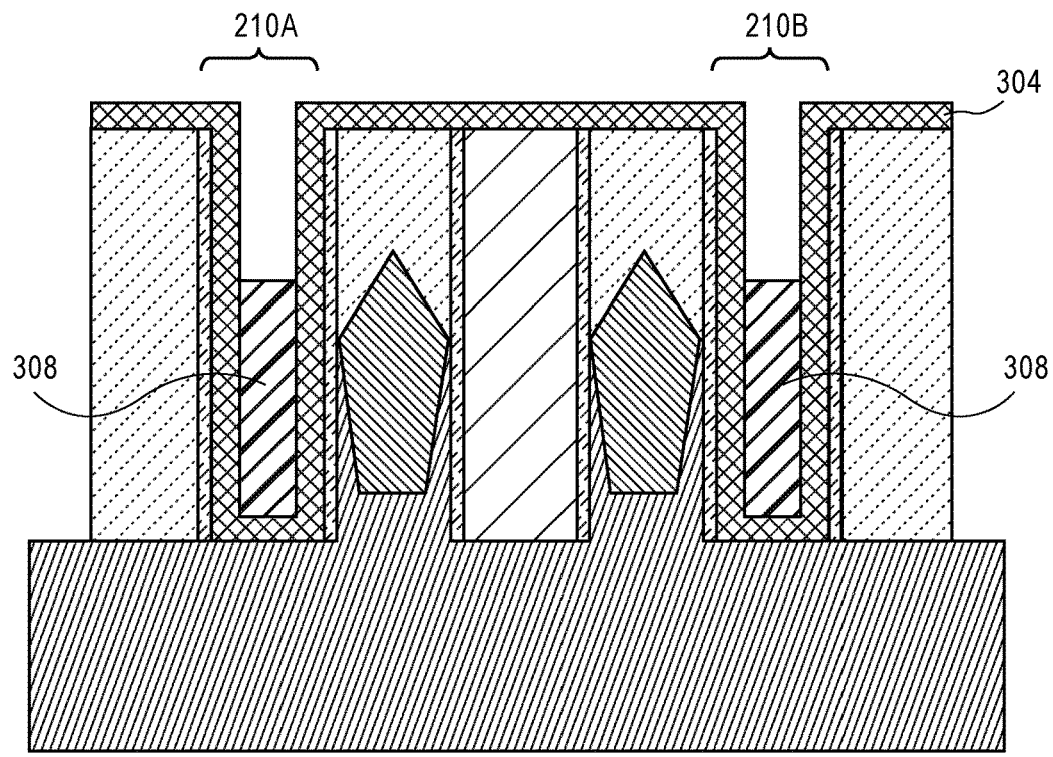

Referring to FIGS. 3D and 3E, a second dielectric material 308 is formed between the first dielectric material 304 along the sidewalls of the first and second trenches 210A and 210B and on the first dielectric layer 304 on the bottoms of the first and second trenches 210A and 210B. In an embodiment, the second dielectric material 308 is different from the first dielectric material.

In one embodiment, the second dielectric material 308 is formed by first forming a silicon oxide material 306 along the sidewalls of the first and second trenches and on the first dielectric layer on the bottoms of the first and second trenches, as is depicted in FIG. 3D. In a particular embodiment, the silicon oxide material 306 is a flowable material that is flowed to completely fill the trenches 210A and 21B without voids or seams. The silicon oxide material may be planarized after deposition, either before or after final cross-linking. The silicon oxide material 306 is then cured. In a particular embodiment, the silicon oxide material 306 shrinks in volume during the cure to provide the second dielectric material 308, as is depicted in FIG. 3E. In one such embodiment, the curing process is a steam curing process. In an embodiment, upon shrinking in volume, the resulting second dielectric material 308 pulls on the end 202B or 202C of the fin 202, inducing tensile stress.

Figure 3F:
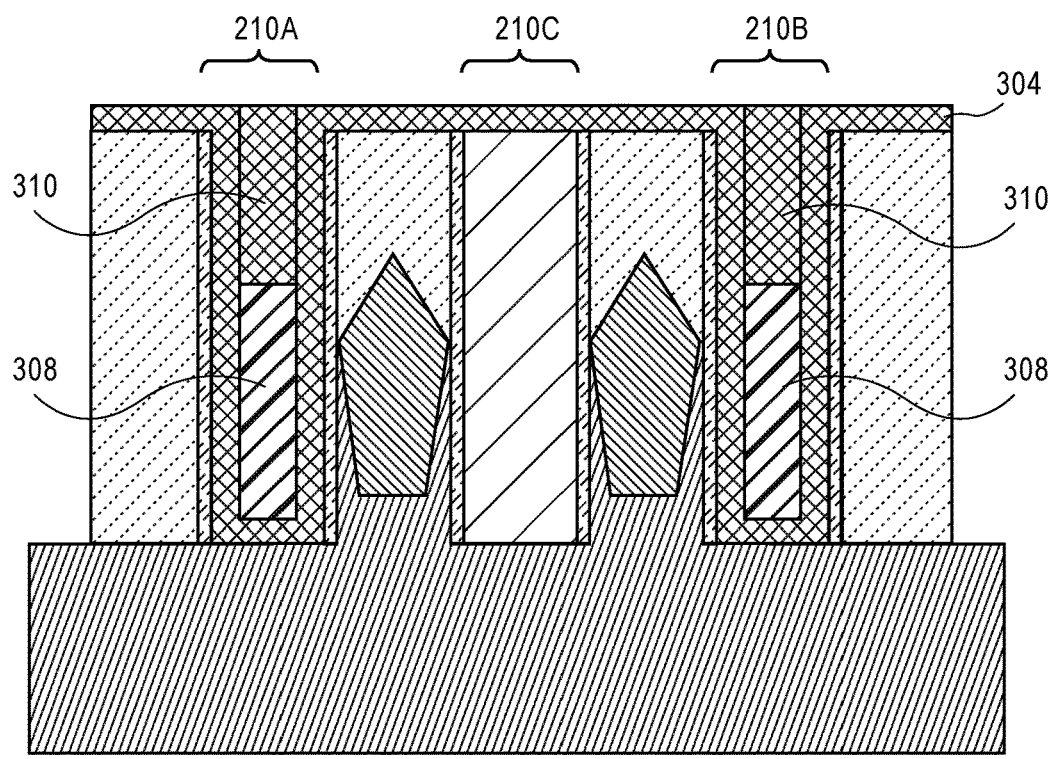

Referring to FIG. 3F, a third dielectric material 310 is then formed on the second dielectric material 308. In an embodiment, the third dielectric material 310 is a second silicon nitride material, similar to the silicon nitride material of layer 304, and may this be referred to as a same dielectric material as layer 304. In one such embodiment, such a silicon nitride capping layer is included to prevent etching of the oxide layer 308 in downstream etches such as contact-opening etches. In another embodiment, however, the third dielectric material 310 is not similar to layer 304.

In an embodiment, further processing of the structure of FIG. 3F includes planarization to confine the material layers 304, 308 and 310 to the trenches 210A and 210B, e.g., to form dielectric plugs 208A and 208B, respectively, as described in association with FIG. 2. In an embodiment, yet further processing of the structure of FIG. 3F includes, subsequent to forming first and second dielectric plugs 208A and 208B, removing the second of the plurality of dummy gate structures (middle 302) to form a third trench 210C between the first end and the second end of the semiconductor fin 202. A permanent gate electrode is then formed in the third trench 210C. The permanent gate electrode is formed over the region of the top surface 202A and laterally adjacent to the region of the pair of sidewalls 202D of the semiconductor fin 202, e.g., to define a channel region of the semiconductor fin 202.

Figure 4B:
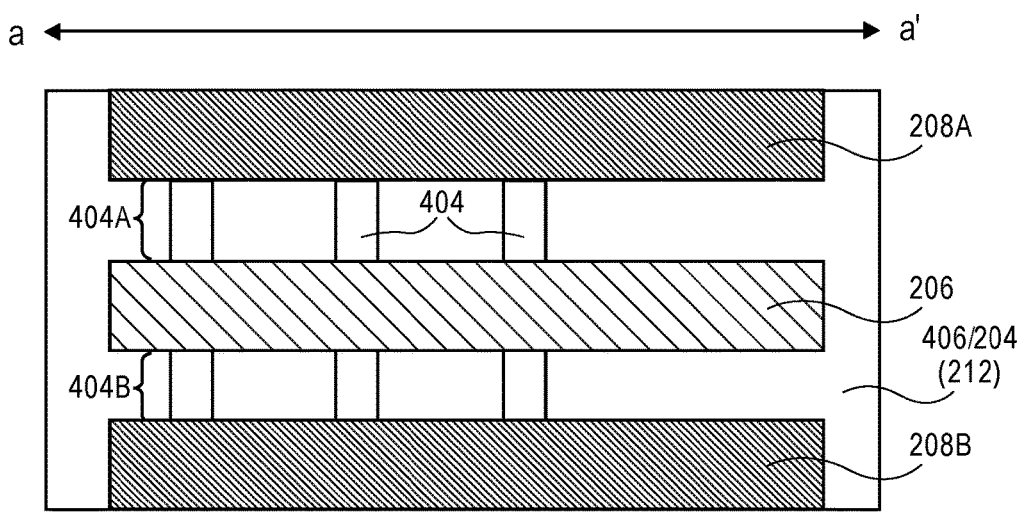

It is to be understood that the structures resulting from the above exemplary processing schemes, e.g., structures from FIG. 3F, may be used in a same or similar form for subsequent processing operations to complete device fabrication, such as PMOS and NMOS device fabrication. As an example of a completed device, FIGS. 4A and 4B illustrate a cross-sectional view and a plan view (taken along the a-a' axis of the cross-sectional view), respectively, of a non-planar semiconductor device having fin-end stress-inducing features, in accordance with an embodiment of the present invention.

Referring to FIG. 4A, a semiconductor structure or device 400 includes a non-planar active region (e.g., a fin structure including protruding fin portion 404 and sub-fin region 405, making up fins 202) formed from a substrate 204, and within isolation region 406. A gate structure 206 is disposed over the protruding portions 404 of the non-planar active region as well as over a portion of the isolation region 406. As shown, gate structure 206 includes a gate electrode 450 and a gate dielectric layer 452. In one embodiment, gate structure 206 also includes a dielectric cap layer 454, as is shown. An inter-layer-dielectric layer 212 may surround the gate structure 206, as is also shown.

In an embodiment, the fin structures 202 are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach.

Referring again to FIG. 4A, a gate contact 414, and overlying gate contact via 416 are also seen from this perspective, along with an overlying metal interconnect 460, all of which are disposed in inter-layer dielectric stacks or layer(s) 470. Also seen from the perspective of FIG. 4A, the gate contact 414 is, in one embodiment, disposed over isolation region 306, but not over the non-planar active regions 404 of fins 202. As is also depicted in FIG. 4A, an interface 480 exists between the doping profile of protruding fin portion 404 and sub-fin region 405 of each of the fins 202. The interface 480 can be a transition region that is relatively abrupt.

Referring to FIG. 4B, the gate structure 206 is shown as disposed over the protruding fin portions 404. Also seen in FIG. 4B, the dielectric plugs 208A and 208B are on either side of and are parallel with the gate structure 206. The dielectric plugs 208A and 208B are at the ends of the protruding portions 404 of the semiconductor fins 202. It is to be appreciated that in the view of FIG. 4B, dielectric layer 212 is omitted, as indicated by the isolation layer/substrate labeling 406/204.

Referring again to FIG. 4B, source and drain regions 404A and 404B of the protruding fin portions 404 can be seen from this perspective. In one embodiment, the source and drain regions 404A and 404B are doped portions of original material of the protruding fin portions 404. In another embodiment, the material of the protruding fin portions 404 is removed and replaced with another semiconductor material, e.g., by epitaxial deposition to form embedded source and drain regions. In either case, the source and drain regions 404A and 404B may extend below the height of dielectric layer 406, i.e., into the sub-fin region 405. In accordance with an embodiment of the present invention, the more heavily doped sub-fin regions, i.e., the doped portions of the fins below interface 480, inhibits source to drain leakage through this portion of the bulk semiconductor fins.

In an embodiment, the semiconductor structure or device 400 is a non-planar device such as, but not limited to, a fin-FET or a tri-gate device. In such an embodiment, a corresponding semiconducting channel region is composed of or is formed in a three-dimensional body. In one such embodiment, the gate structures 206 surround at least a top surface and a pair of sidewalls of the three-dimensional body.

Substrate 204 may be composed of a semiconductor material that can withstand a manufacturing process and in which charge can migrate. In an embodiment, substrate 204 is a bulk substrate composed of a crystalline silicon, silicon/germanium or germanium layer doped with a charge carrier, such as but not limited to phosphorus, arsenic, boron or a combination thereof, to form active region 404. In one embodiment, the concentration of silicon atoms in bulk substrate 204 is greater than 97%. In another embodiment, bulk substrate 204 is composed of an epitaxial layer grown atop a distinct crystalline substrate, e.g. a silicon epitaxial layer grown atop a boron-doped bulk silicon mono-crystalline substrate. Bulk substrate 204 may alternatively be composed of a group II-V material. In an embodiment, bulk substrate 204 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 204 is composed of a III-V material and the charge-carrier dopant impurity atoms are ones such as, but not limited to, carbon, silicon, germanium, oxygen, sulfur, selenium or tellurium. Alternatively, the structure 400 may be fabricated from a semiconductor-on-insulator (SOI) substrate. An SOI substrate includes a lower bulk substrate, a middle insulator layer and a top monocrystalline layer. In an embodiment, the SOI substrate is formed by wafer transfer. In an embodiment, fins 202 are formed from the top monocrystalline layer of an SOI substrate.

The materials of the dielectric plugs 208A and 208B may be as described above. Isolation region 406 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 406 is composed of a dielectric material such as, but not limited to, silicon dioxide, silicon oxy-nitride, silicon nitride, or carbon-doped silicon nitride.

Gate structure 206 may be a gate electrode stack which includes a gate dielectric layer 452 and a gate electrode 450. In an embodiment, the gate electrode 450 of the gate electrode stack is composed of a metal gate and the gate dielectric layer 452 is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 204. In an embodiment, the gate dielectric layer 452 is composed of a top high-k portion and a lower portion composed of an oxide of a semiconductor material. In one embodiment, the gate dielectric layer 452 is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate.

In one embodiment, the gate electrode 450 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode 450 is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate structures 206 and/or with dielectric plugs 208A and 208B may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 414 and overlying gate contact via 416 and interconnect 460 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of tungsten or copper structures that may or may not include barrier layers (such as Ta or TaN layers) between the tungsten or copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 400 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, as described above, the gate structure 206 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 400. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 4A, the arrangement of semiconductor structure or device 400 places the gate contact over isolation regions, e.g., over region 406. Such an arrangement may, in some instances, be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

Figure 5:
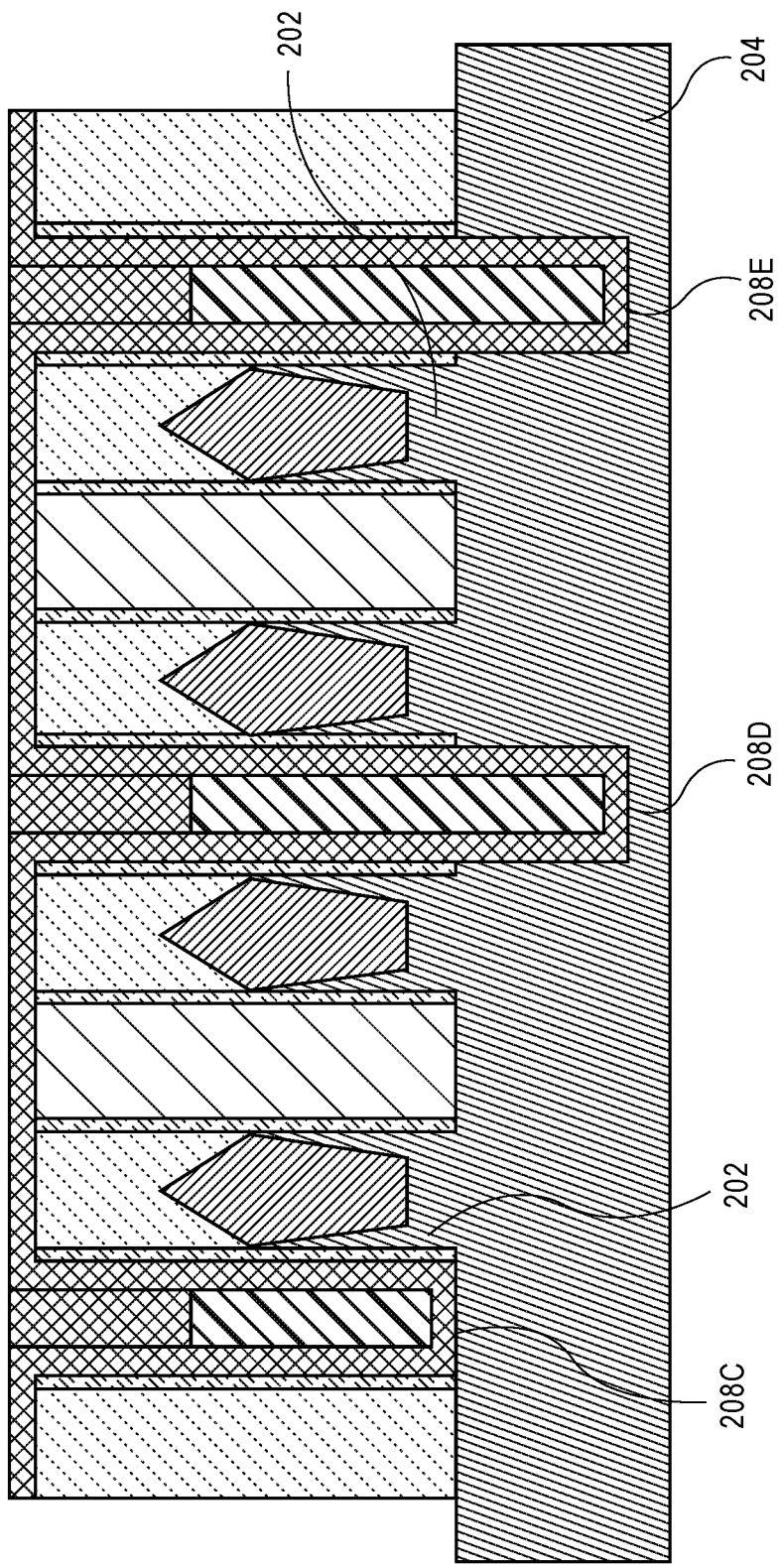
FIG. 5 illustrates a cross-sectional view of another semiconductor structure having fin-end stress-inducing features, in accordance with another embodiment of the present invention.

In another aspect, the depth of individual dielectric plugs may be varied within a semiconductor structure or within an architecture formed on a common substrate. As an example, FIG. 5 illustrates a cross-sectional view of another semiconductor structure having fin-end stress-inducing features, in accordance with another embodiment of the present invention. Referring to FIG. 5, a shallow dielectric plug 208C is included along with a pair of deep dielectric plugs 208D/208E. In one such embodiment, as depicted, the shallow dielectric plug 208C is at a depth approximately equal to the depth of the semiconductor fin 202 within substrate 204, while the pair of deep dielectric plugs 208D/208E is at a depth below the depth of the semiconductor fin 202 within substrate 204.

Referring again to FIG. 5, such an arrangement may enable stress amplification on fin trim isolation (FTI) devices in a trench that etches deeper into the substrate 204 in order to provide isolation between adjacent fins 202. Such an approach may be implemented to increases the density of transistors on a chip. In an embodiment, the stress effect induced on transistors from the plug fill is magnified in FTI transistors since the stress transfer occurs in both the fin and in a substrate/well underneath the transistor.

Figure 6:
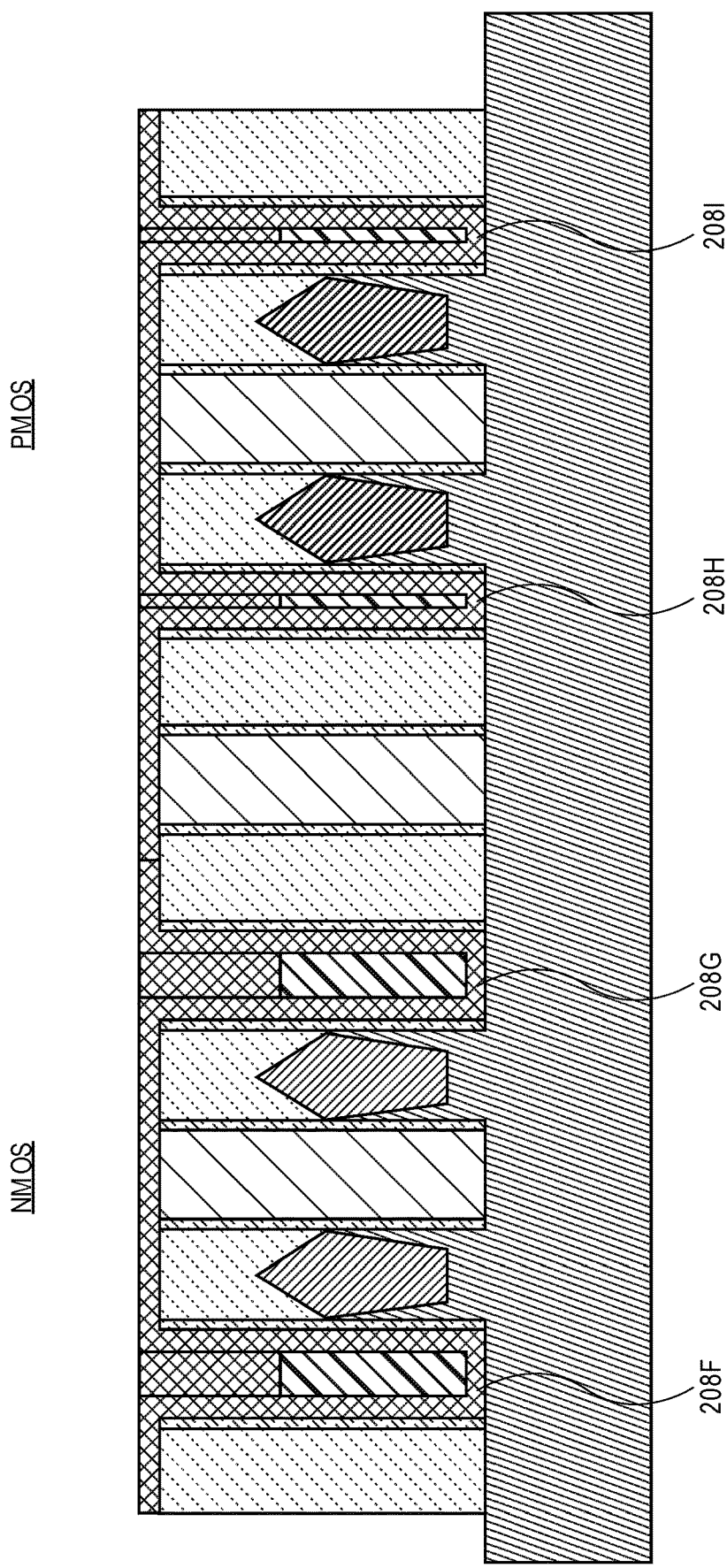
FIG. 6 illustrates a cross-sectional view of another semiconductor structure having fin-end stress-inducing features, in accordance with another embodiment of the present invention.

In another aspect, the width or amount of the tensile stress-inducing oxide layer 308 included in a dielectric plug may be varied within a semiconductor structure or within an architecture formed on a common substrate, e.g., depending if the device is a PMOS device or an NMOS device. As an example, FIG. 6 illustrates a cross-sectional view of another semiconductor structure having fin-end stress-inducing features, in accordance with another embodiment of the present invention. Referring to FIG. 6, in a particular embodiment, NMOS devices include relatively more of the tensile stress-inducing oxide layer 308 than corresponding PMOS devices.

With reference again to FIG. 6, in an embodiment, differentiating plug fill is implemented to induce appropriate stress in NMOS and PMOS. The plug fill may be patterned to induce different stress in NMOS and PMOS devices. For example, lithographic patterning may be used to open up PMOS devices (e.g., widen the dielectric plug trenches for PMOS devices), at which point different fill options can be performed to differentiate the plug fill in N/PMOS devices. In an exemplary embodiment, reducing the volume of flowable oxide in the plug on PMOS devices can reduce the induced tensile stress. In one such embodiment, compressive stress may be dominate, e.g., from compressively stressing source and drain regions. In other embodiments, the use of different plug liners or different fill materials provides tunable stress control.

As described above, it is to be appreciated that poly plug stress effects can benefit both NMOS transistors (e.g., tensile channel stress) and PMOS transistors (e.g., compressive channel stress). In accordance with an embodiment of the present invention, a semiconductor fin 202 of the semiconductor structure 200 or 400 is a uniaxially stressed semiconductor fin. The uniaxially stressed semiconductor fin may be uniaxially stressed with tensile stress or with compressive stress. For example, FIG. 7 illustrates an angled view of a fin having tensile uniaxial stress, while FIG. 8 illustrates an angled view of a fin having compressive uniaxial stress, in accordance with one or more embodiments of the present invention.

Figure 7:
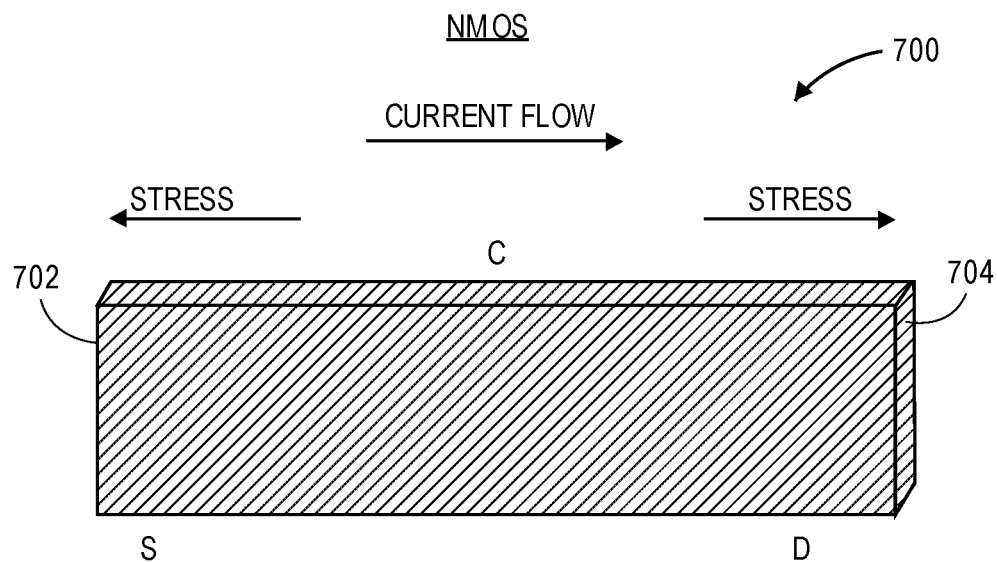
FIG. 7 illustrates an angled view of a fin having tensile uniaxial stress, in accordance with an embodiment of the present invention.

Referring to FIG. 7, a semiconductor fin 700 has a discrete channel region (C) disposed therein. A source region (S) and a drain region (D) are disposed in the semiconductor fin 700, on either side of the channel region (C). The discrete channel region of the semiconductor fin 700 has a current flow direction along the direction of a uniaxial tensile stress (arrows pointed away from one another), from the source region (S) to the drain region (D).

Figure 8:
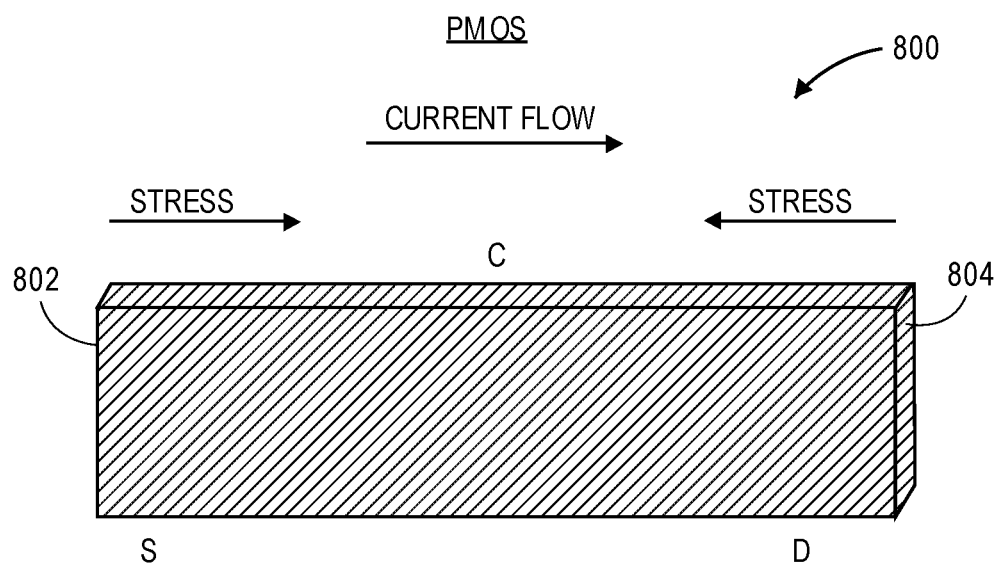
FIG. 8 illustrates an angled view of a fin having compressive uniaxial stress, in accordance with an embodiment of the present invention.

Referring to FIG. 8, a semiconductor fin 800 has a discrete channel region (C) disposed therein. A source region (S) and a drain region (D) are disposed in the semiconductor fin 800, on either side of the channel region (C). The discrete channel region of the semiconductor fin 800 has a current flow direction along the direction of a uniaxial compressive stress (arrows pointed toward one another), from the source region (S) to the drain region (D).

Accordingly, embodiments described herein may be implemented to improve transistor mobility and drive current, allowing for faster performing circuits and chips. Stress measurements made from transmission electron micrograph (TEM) samples show modulation of channel stress with the above described dielectric plug process.

Figure 9A:
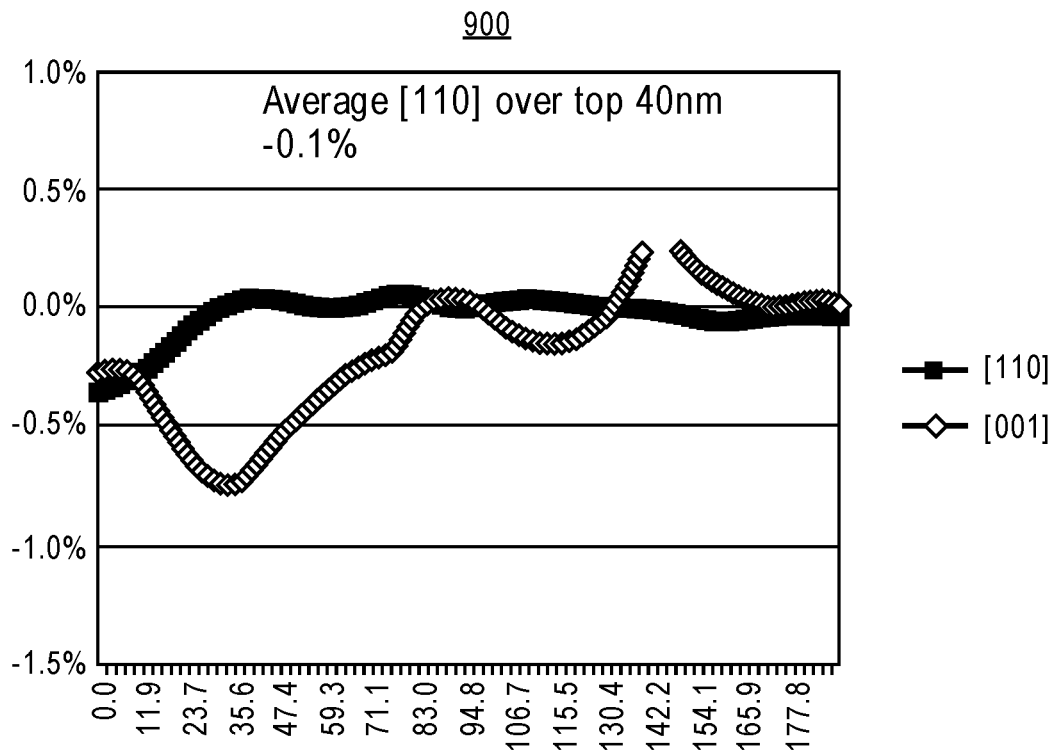
FIG. 9A includes a plot showing a channel stress average along the [110] plane over a top 40 nanometers of a fin without inclusion of dielectric plugs according to embodiments described herein.
Figure 9B:
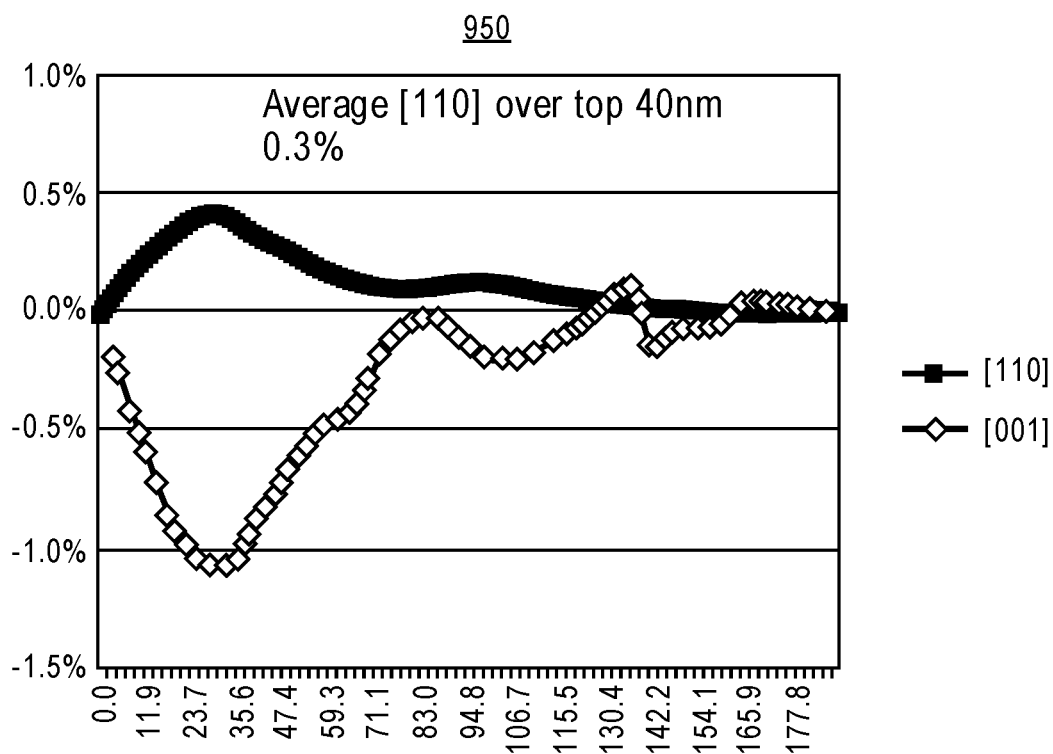
FIG. 9B includes a plot showing a channel stress average along the [110] plane over a top 40 nanometers of a fin including dielectric plugs according to embodiments described herein.

For example, FIG. 9A includes a plot 900 showing a channel stress average along the [110] plane over a top 40 nanometers of a fin without inclusion of dielectric plugs according to embodiments described herein, while FIG. 9B includes a plot 950 showing a channel stress average along the [110] plane over a top 40 nanometers of a fin including dielectric plugs according to embodiments described herein. The plot 900 shows an average stress loss of about 0.1%, while the plot 950 shows an average stress gain of about 0.3%.

It is to be appreciated that the layers and materials described herein and as used throughout the present disclosure are typically formed on or above an underlying semiconductor substrate or structure. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as germanium-based materials or group II-V materials. The substrate may also include semiconductor materials, metals, dielectrics, dopants, and other materials commonly found in semiconductor substrates.

In an embodiment, as used throughout the present description, interlayer dielectric (ILD) material, such as the material of ILD layers 212 and/or 470, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers may be formed by CVD, PVD, or by other deposition methods.

In an embodiment, as is also used throughout the present description, lithographic operations are performed using 193 nm immersion litho (i 193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
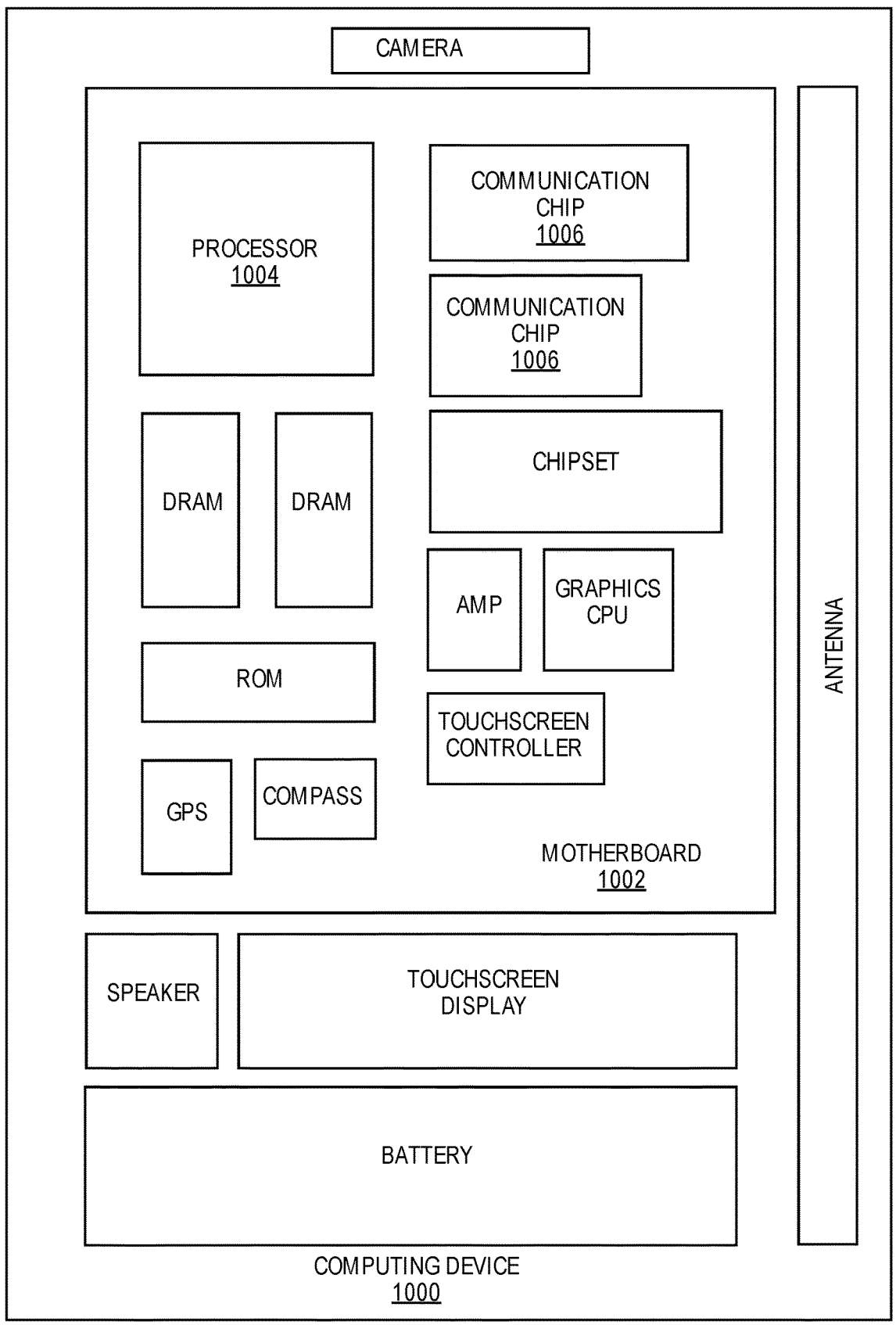
FIG. 10 illustrates a computing device in accordance with one implementation of an embodiment of the present invention.

FIG. 10 illustrates a computing device 1000 in accordance with one implementation of an embodiment of the present invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as semiconductor devices having fin-end stress-inducing features built in accordance with implementations of embodiments of the present invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as semiconductor devices having fin-end stress-inducing features built in accordance with implementations of embodiments of the present invention.

In further implementations, another component housed within the computing device 1000 may contain an integrated circuit die that includes one or structures, such as semiconductor devices having fin-end stress-inducing features built in accordance with implementations of embodiments of the present invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
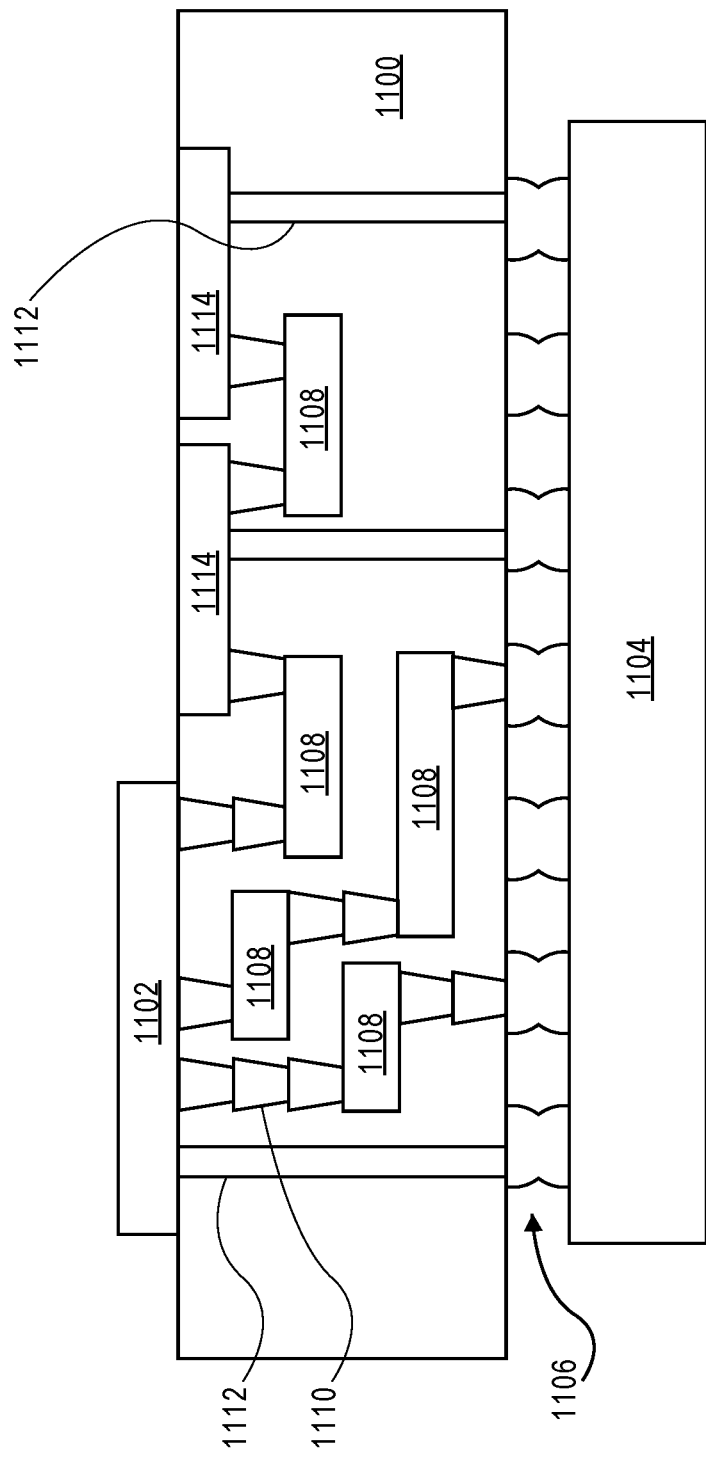
FIG. 11 illustrates an interposer that includes one or more embodiments of the present invention.

FIG. 11 illustrates an interposer 1100 that includes one or more embodiments of the present invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the invention, apparatuses or processes disclosed herein may be used in the fabrication of interposer 1100 or in the fabrication of components included in the interposer 1100.

Thus, embodiments of the present invention include semiconductor devices having fin-end stress-inducing features, and methods of fabricating semiconductor devices having fin-end stress-inducing features.

Example Embodiment 1

A semiconductor structure includes a semiconductor fin protruding through a trench isolation region above a substrate. The semiconductor fin has a top surface, a first end, a second end, and a pair of sidewalls between the first end and the second end. A gate electrode is over a region of the top surface and laterally adjacent to a region of the pair of sidewalls of the semiconductor fin. The gate electrode is between the first end and the second end of the semiconductor fin. A first dielectric plug is at the first end of the semiconductor fin. A second dielectric plug is at the second end of the semiconductor fin. The first and second dielectric plugs each include a first dielectric material laterally surrounding and below a second dielectric material different from the first dielectric material.

Example Embodiment 2

The semiconductor structure of example embodiment 1, wherein the first dielectric material is silicon nitride, and the second semiconductor material is silicon oxide.

Example Embodiment 3

The semiconductor structure of example embodiment 1 or 2, wherein the first dielectric material is further over the second dielectric material.

Example Embodiment 4

The semiconductor structure of example embodiment 1 or 2, wherein the first and second dielectric plugs each further include a third dielectric material over the second dielectric material and between portions of the first semiconductor material, the third dielectric material different from the first and second dielectric materials.

Example Embodiment 5

The semiconductor structure of example embodiment 1, 2, 3 or 4, wherein the first and second dielectric plugs are each disposed in a corresponding trench disposed in an inter-layer dielectric layer.

Example Embodiment 6

The semiconductor structure of example embodiment 5, wherein each corresponding trench includes a dielectric sidewall spacer.

Example Embodiment 7

The semiconductor structure of example embodiment 1, 2, 3, 4, 5 or 6, further including a first source/drain region between the gate electrode and the first dielectric plug at the first end of the semiconductor fin, and a second source/drain region between the gate electrode and the second dielectric plug at the second end of the semiconductor fin.

Example Embodiment 8

The semiconductor structure of example embodiment 7, wherein the first and second source/drain regions are embedded source/drain regions including a semiconductor material different than the semiconductor fin.

Example Embodiment 9

The semiconductor structure of example embodiment 1, 2, 3, 4, 5, 6, 7 or 8, wherein both of the first dielectric plug and the second dielectric plug are free of voids.

Example Embodiment 10

The semiconductor structure of example embodiment 1, 2, 3, 4, 5, 6, 7, 8 or 9, wherein one or both of the first dielectric plug and the second dielectric plug is deeper into the substrate than the semiconductor fin.

Example Embodiment 11

The semiconductor structure of example embodiment 1, 2, 3, 4, 5, 6, 7, 8, 9 or 10, wherein the region of the top surface and the region of the pair of sidewalls of the semiconductor fin define a channel region of an N-type semiconductor device, and wherein the first dielectric plug and the second dielectric plug induce a uniaxial tensile stress on the channel region.

Example Embodiment 12

The semiconductor structure of example embodiment 1, 2, 3, 4, 5, 6, 7, 8, 9 or 10, wherein the region of the top surface and the region of the pair of sidewalls of the semiconductor fin define a channel region of a P-type semiconductor device, and wherein the first dielectric plug and the second dielectric plug induce a uniaxial compressive stress on the channel region.

Example Embodiment 13

A semiconductor structure includes a semiconductor fin protruding through a trench isolation region above a substrate. The semiconductor fin has a top surface, a first end, a second end, and a pair of sidewalls between the first end and the second end. A gate electrode is over a region of the top surface and laterally adjacent to a region of the pair of sidewalls of the semiconductor fin. The gate electrode is between the first end and the second end of the semiconductor fin. A first dielectric plug is at the first end of the semiconductor fin. A second dielectric plug is at the second end of the semiconductor fin. Both of the first dielectric plug and the second dielectric plug are free of voids.

Example Embodiment 14

The semiconductor structure of example embodiment 13, wherein the first and second dielectric plugs are each disposed in a corresponding trench disposed in an inter-layer dielectric layer.

Example Embodiment 15

The semiconductor structure of example embodiment 14, wherein each corresponding trench includes a dielectric sidewall spacer.

Example Embodiment 16

The semiconductor structure of example embodiment 13, 14 or 15, further including a first source/drain region between the gate electrode and the first dielectric plug at the first end of the semiconductor fin, and a second source/drain region between the gate electrode and the second dielectric plug at the second end of the semiconductor fin.

Example Embodiment 17

The semiconductor structure of example embodiment 16, wherein the first and second source/drain regions are embedded source/drain regions including a semiconductor material different than the semiconductor fin.

Example Embodiment 18

The semiconductor structure of example embodiment 13, 14, 15, 16 or 17, wherein one or both of the first dielectric plug and the second dielectric plug is deeper into the substrate than the semiconductor fin.

Example Embodiment 19

The semiconductor structure of example embodiment 13, 14, 15, 16, 17 or 18, wherein the region of the top surface and the region of the pair of sidewalls of the semiconductor fin define a channel region of an N-type semiconductor device, and wherein the first dielectric plug and the second dielectric plug induce a uniaxial tensile stress on the channel region.

Example Embodiment 20

The semiconductor structure of example embodiment 13, 14, 15, 16, 17 or 18, wherein the region of the top surface and the region of the pair of sidewalls of the semiconductor fin define a channel region of a P-type semiconductor device, and wherein the first dielectric plug and the second dielectric plug induce a uniaxial compressive stress on the channel region.

Example Embodiment 21

A method of fabricating a semiconductor structure includes forming a semiconductor fin protruding through a trench isolation region above a substrate. The semiconductor fin having a top surface, a first end, a second end, and a pair of sidewalls between the first end and the second end. A plurality of dummy gate structures is formed above the semiconductor fin and separated from one another by an inter-layer dielectric (ILD) layer. A first of the plurality of dummy gate structures is at the first end of the semiconductor fin. A second of the plurality of dummy gate structures over a region of the top surface and laterally adjacent to a region of the pair of sidewalls of the semiconductor fin. A third of the plurality of dummy gate structures at the second end of the semiconductor fin. The first and the third of the plurality of dummy gate structures are removed but not the second of the plurality of dummy gate structures. Removing the first and the third of the plurality of dummy gate structures forms a first trench in the ILD layer at the first end of the semiconductor fin and forms a second trench in the ILD layer at the second end of the semiconductor fin. A first dielectric plug is formed in the first trench and a second dielectric plug in the second trench. Forming the first and second dielectric plugs includes forming a first dielectric material along sidewalls and bottoms of the first and second trenches, and forming a second dielectric material between the first dielectric material along the sidewalls of the first and second trenches and on the first dielectric layer on the bottoms of the first and second trenches. The second dielectric material different from the first dielectric material.

Example Embodiment 22

The method of example embodiment 21, wherein the first of the plurality of dummy gate structures is formed over a portion of the first end and a first portion of the top surface of the semiconductor fin, and the third of the plurality of dummy gate structures is formed over a portion of the second end and a second portion of the top surface of the semiconductor fin.

Example Embodiment 23

The method of example embodiment 21 or 22, further including, subsequent to forming the first and second dielectric plugs, removing the second of the plurality of dummy gate structures to form a third trench between the first end and the second end of the semiconductor fin, and forming a permanent gate electrode in the third trench, the permanent gate electrode over the region of the top surface and laterally adjacent to the region of the pair of sidewalls of the semiconductor fin.

Example Embodiment 24

The method of example embodiment 21, 22 or 23, wherein forming the second dielectric material of the first and second dielectric plugs includes depositing a flowable silicon dioxide precursor in the first and second trenches and on the first dielectric layer on the bottoms of the first and second trenches, converting the precursor to silicon dioxide, and curing the silicon oxide material to reduce a volume of the silicon oxide material.

Example Embodiment 25

The method of example embodiment 21, 22, 23 or 24, wherein forming the first and second dielectric plugs further includes forming a third dielectric material on the second dielectric material.

What is claimed is:

1. A semiconductor structure, comprising:
 a semiconductor fin protruding through a trench isolation region above a substrate, the semiconductor fin having a top surface, a first end, a second end, and a pair of sidewalls between the first end and the second end;
 a gate electrode over a region of the top surface and laterally adjacent to a region of the pair of sidewalls of the semiconductor fin, the gate electrode between the first end and the second end of the semiconductor fin;
 a first dielectric plug at the first end of the semiconductor fin; and
 a second dielectric plug at the second end of the semiconductor fin, wherein the first and second dielectric plugs each comprise a first dielectric material laterally surrounding and below a second dielectric material different from the first dielectric material, wherein the first dielectric material of the first dielectric plug is in contact with the first end of the semiconductor fin, and the first dielectric material of the second dielectric plug is in contact with the second end of the semiconductor fin.

2. The semiconductor structure of claim 1, wherein the first dielectric material is silicon nitride, and the second semiconductor material is silicon oxide.

3. The semiconductor structure of claim 1, wherein the first dielectric material is further over the second dielectric material.

4. The semiconductor structure of claim 1, wherein the first and second dielectric plugs each further comprise a third dielectric material over the second dielectric material and between portions of the first dielectric material, the third dielectric material different from the first and second dielectric materials.

5. The semiconductor structure of claim 1, wherein the first and second dielectric plugs are each disposed in a corresponding trench disposed in an inter-layer dielectric layer.

6. The semiconductor structure of claim 5, wherein each corresponding trench comprises a dielectric sidewall spacer.

7. The semiconductor structure of claim 1, further comprising:
 a first source/drain region between the gate electrode and the first dielectric plug at the first end of the semiconductor fin; and
 a second source/drain region between the gate electrode and the second dielectric plug at the second end of the semiconductor fin.

8. The semiconductor structure of claim 7, wherein the first and second source/drain regions are embedded source/drain regions comprising a semiconductor material different than the semiconductor fin.

9. The semiconductor structure of claim 1, wherein both of the first dielectric plug and the second dielectric plug are free of voids.

10. The semiconductor structure of claim 1, wherein one or both of the first dielectric plug and the second dielectric plug is deeper into the substrate than the semiconductor fin.

11. The semiconductor of claim 1, wherein the region of the top surface and the region of the pair of sidewalls of the semiconductor fin define a channel region of an N-type semiconductor device, and wherein the first dielectric plug and the second dielectric plug induce a uniaxial tensile stress on the channel region.

12. The semiconductor of claim 1, wherein the region of the top surface and the region of the pair of sidewalls of the semiconductor fin define a channel region of a P-type semiconductor device, and wherein the first dielectric plug and the second dielectric plug induce a uniaxial compressive stress on the channel region.

* * * * *